United States Patent
Rennschmid et al.

(10) Patent No.: US 10,562,778 B2
(45) Date of Patent: Feb. 18, 2020

(54) DEVICE FOR INSULATING AND SEALING ELECTRODE HOLDERS IN CVD REACTORS

(71) Applicant: Wacker Chemie AG, Munich (DE)

(72) Inventors: Dominik Rennschmid, Burghausen (DE); Heinz Kraus, Zeilarn (DE); Christian Kutza, Ampfing (DE)

(73) Assignee: WACKER CHEMIE AG, Munich (DE)

( * ) Notice: Subject to any disclaimer, the term of this patent is extended or adjusted under 35 U.S.C. 154(b) by 0 days.

(21) Appl. No.: 15/744,180

(22) PCT Filed: Oct. 10, 2016

(86) PCT No.: PCT/EP2016/074230
§ 371 (c)(1),
(2) Date: Jan. 12, 2018

(87) PCT Pub. No.: WO2017/064011
PCT Pub. Date: Apr. 20, 2017

(65) Prior Publication Data
US 2018/0208469 A1 Jul. 26, 2018

(30) Foreign Application Priority Data
Oct. 15, 2015 (DE) .................. 10 2015 220 127

(51) Int. Cl.
*C23C 16/24* (2006.01)
*C01B 33/035* (2006.01)
*C23C 16/44* (2006.01)
*C23C 16/46* (2006.01)

(52) U.S. Cl.
CPC ............ *C01B 33/035* (2013.01); *C23C 16/24* (2013.01); *C23C 16/4409* (2013.01); *C23C 16/46* (2013.01)

(58) Field of Classification Search
CPC .................................................. C23C 16/24
See application file for complete search history.

(56) References Cited

U.S. PATENT DOCUMENTS

| | | |
|---|---|---|
| 2003/0148870 A1 | 8/2003 | Araki et al. |
| 2005/0152089 A1 | 7/2005 | Matsuda et al. |
| 2010/0058988 A1 | 3/2010 | Endoh et al. |
| 2010/0147219 A1* | 6/2010 | Hsieh ................. C01B 33/035 118/723 R |
| 2011/0305604 A1 | 12/2011 | Stocklinger |
| 2012/0300200 A1* | 11/2012 | Atkinson ............. E21B 47/011 356/246 |
| 2013/0011581 A1 | 1/2013 | Muller et al. |

(Continued)

FOREIGN PATENT DOCUMENTS

| | | |
|---|---|---|
| CA | 2048586 A1 | 2/1992 |
| CN | 101565184 A | 10/2009 |
| CN | 202193621 U | 4/2012 |

(Continued)

*Primary Examiner* — Elizabeth A Burkhart
(74) *Attorney, Agent, or Firm* — Brooks Kushman P.C.

(57) ABSTRACT

Improved sealing of Siemens reactor electrodes which results in improved reactor campaign times, is accomplished by use of an electrically insulating ring in combination with two seals, a first seal located in a groove in the insulating ring or in a groove in the reactor base plate adjacent the insulating ring, and a second seal not contained in a groove.

9 Claims, 7 Drawing Sheets

(56) References Cited

U.S. PATENT DOCUMENTS

2017/0222388 A1\* 8/2017 Ma .......................... H01S 3/02

FOREIGN PATENT DOCUMENTS

| | | |
|---|---|---|
| CN | 102616783 A | 8/2012 |
| CN | 203034093 U | 7/2013 |
| JP | H06300136 A | 10/1994 |
| JP | 2001163674 A | 6/2001 |
| JP | 2005210077 A | 8/2005 |
| JP | 2008284505 A | 11/2008 |
| WO | 2011092276 A1 | 8/2011 |
| WO | 2014143910 A1 | 9/2014 |

\* cited by examiner

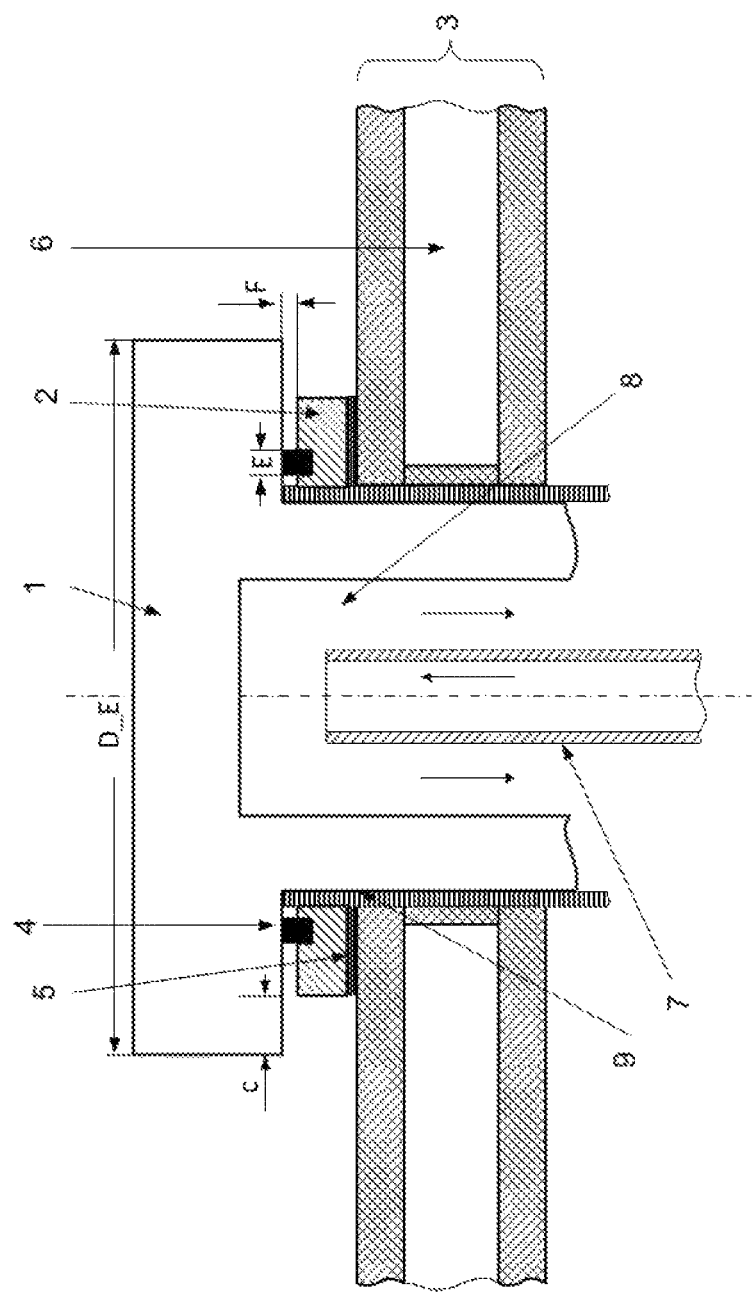

DEVICE FOR INSULATING AND SEALING ELECTRODE HOLDERS IN CVD REACTORS

CROSS REFERENCE TO RELATED APPLICATIONS

This application is the U.S. National Phase of PCT Appln. No. PCT/EP2016/074230 filed Oct. 10, 2016, which claims priority to German Application No. 10 2015 220 127.9 filed Oct. 15, 2015, the disclosures of which are incorporated in their entirety by reference herein.

BACKGROUND OF THE INVENTION

1. Field of the Invention

The invention relates to an apparatus for insulating and sealing electrode holders in a reactor for depositing polycrystalline silicon, and to a process for producing polycrystalline silicon using such an apparatus.

2. Description of the Related Art

High-purity silicon is generally produced by the Siemens process. This comprises introducing a reaction gas comprising hydrogen and one or more silicon-containing components into a reactor fitted with support bodies heated by direct passage of current, upon which solid silicon is deposited. Preferably employed silicon-containing compounds are silane ($SiH_4$), monochlorosilane ($SiH_3Cl$), dichlorosilane ($SiH_2Cl_2$), trichlorosilane ($SiHCl_3$), tetrachlorosilane ($SiCl_4$) and mixtures thereof.

Each support body is generally composed of two thin filament rods and one bridge which generally connects adjacent rods at their free ends. The filament rods are most commonly fabricated from mono- or polycrystalline silicon, metals/alloys or carbon being employed more rarely. The filament rods are slotted vertically into electrodes located on the reactor floor which provide the connection to the electrode holder and current supply. High-purity polysilicon is deposited on the heated filament rods and the horizontal bridge to increase the diameter thereof over time. The process is terminated once the desired diameter has been achieved.

The silicon rods are held in the CVD reactor by special electrodes generally made of graphite. In each case two filament rods having different voltage polarities at the electrode holders are connected by a bridge at the other slim rod end to form a closed electrical circuit. Electrical energy for heating the slim rods is supplied via the electrodes and their electrode holders. This causes the diameter of the slim rods to increase. The electrode simultaneously grows into the rod base of the silicon rods, starting at its tip. Once a desired target diameter for the silicon rods has been achieved the deposition process is terminated and the silicon rods are cooled and removed.

The sealing of the electrode holder which passes through the floor plate is of particular importance.

Escaping chlorosilane reacts with the oxygen and the moisture in the surrounding air to form silica and HCl which, with further moisture, condenses in the form of aqueous HCl. The reaction products silica and aqueous HCl and also corrosion products generated by HCl are deposited at the end of the feedthrough of the electrode holder through the floor plate and bridge the insulation of the electrode holder to the floor plate, thus resulting in a ground fault and outage of the deposition reactor.

Since the reaction products accumulate at the location of formation at a desired operating time of the deposition reactor (service life between 2 overhauls) spanning several months even small leaks and leakage streams can result in premature failure through ground faults. When considering leakage streams it is necessary to consider not only leakage at the sealing surfaces but also leakage by diffusion through the sealing material itself.

The use of sealing bodies has been proposed to this end, importance attaching in particular to the arrangement and shape of the sealing bodies and the sealing material employed.

Located between the top of the electrode holder, which protrudes into the deposition equipment, and the floor plate is an annular body. This body typically has two functions: 1) sealing of the electrode holder feedthrough and 2) electrical insulation of the electrode holder from the floor plate.

The high gas-space temperature in the CVD reactor necessitates thermal protection of hydrocarbon-based sealing bodies. Insufficient thermal protection results in premature wear of the sealing bodies due to scorching of the sealing bodies, thermally induced flow of the sealing body, reactor leaks, the distance between electrode holder and floor plate falling below the minimum value, and ground faults at charred sealing bodies. Ground faults or leaks result in outage of the deposition equipment and hence in the deposition process being aborted. This results in reduced output, a lower yield due to material degradation and higher costs.

US 20110305604 A1 discloses shielding the electrode seals from thermal stress using protective rings made of quartz. The reactor floor has a special configuration. The reactor floor comprises a first region and a second region. The first region is formed by a plate facing toward the interior of the reactor and an intermediate plate carrying the nozzles. The second region of the reactor floor is formed by the intermediate plate and a floor plate carrying the supply connections for the filaments. The cooling water is fed into the first region thus formed in order thus to cool the reactor bottom. The filaments themselves are seated in a graphite adapter. This graphite adapter engages with a graphite clamping ring, which itself interacts with the plate via a quartz ring. The cooling water connections for the filaments may be in the form of quick-fit couplings.

WO 2011092276 A1 describes an electrode holder where the sealing element between the electrode holder and the floor plate is protected against the effects of temperature by a circumferential ceramic ring. A plurality of electrodes are secured in a floor of the reactor. These electrodes carry filament rods seated in an electrode body which supplies current to the electrodes/filament rods. The electrode body itself is mechanically prestressed in the direction of the top face of the floor of the reactor by a plurality of resilient elements. A radially circumferential sealing element is inserted between the top face of the floor of the reactor and a ring of the electrode body which is parallel to the top face of the floor. The sealing element itself is shielded by a ceramic ring in the region between the top face of the floor of the reactor and the ring of the electrode body which is parallel thereto.

The sealing element is made of PTFE and assumes both the sealing function and the insulating function. The ceramic ring serves as a heat shield for the sealing ring.

However, subjecting PTFE to thermal stress above 250° C. results in scorching/cracking at the sealing surface and flow of the sealing body. The distance between the top of the electrode holder and the floor plate thus falls below a minimum value leading to electrical arcing/ground faults from the electrode holder to the floor plate. The scorching/ cracking also releases carbon compounds which lead to contamination of the silicon rods to be deposited due to incorporation of carbon.

US 20130011581 A1 discloses an apparatus for protecting electrode holders in CVD reactors which comprises an electrode which is suitable for accommodating a filament rod and is disposed atop an electrode holder made of an electrically conductive material and mounted in a recess in a floor plate, wherein an intermediate space between the electrode holder and the floor plate is sealed with a sealing material and the sealing material is protected by a protective body constructed from one or more parts and arranged in a ring shape around the electrodes, wherein the height of the protective body increases at least in sections in the direction of the electrode holder.

The document provides for geometrical bodies arranged concentrically around the electrode holder, their height decreasing with an increasing distance from the electrode holder. The body may also be composed of one part. This provides for thermal protection for the sealing and insulating body of the electrode holder and also for flow modification at the rod base of the deposited polysilicon rods, which has a positive influence on the fallover rate.

The apparatuses according to WO 2011092276 A1 and according to US 20130011581 A1 can suffer from ground faults between the electrode holder and the floor plate due to silicon slivers which, on account of thermal stresses due to the high feed rate, spall off the silicon rods, fall between the electrode holder and the ceramic ring/support body and there produce an electrically conducting connection between the electrode holder and the floor plate. Short circuits entail abrupt process termination due to outage of the current supply for heating the rods. The rods cannot be deposited up to the intended end diameter. Thinner rods lead to lower plant capacity which results in considerable costs.

CN 202193621 U discloses an apparatus providing two ceramic rings between the top of the electrode holder and the floor plate with a graphite gasket located between them.

However, this apparatus provides no sealing function between the ceramic ring and the top of the electrode holder nor between the ceramic ring and the floor plate. The reactor consequently suffers from leaks.

CN 101565184 A discloses an insulating ring made of zirconium oxide ceramics material ($ZrO_2$) between the top of the electrode holder and the floor plate. The insulating ring is recessed in the floor plate. An additional quartz ring is therefore required for insulation between the top of the electrode holder and the floor plate. Sealing is achieved via two graphite gaskets between the top of the electrode holder and the insulating ring and between the floor plate and the insulating ring. An O-ring is employed at the electrode feedthrough below the floor plate as a further seal.

CN 102616783 A discloses an insulating ring made of ceramics material between the top of the electrode holder and the floor plate. Sealing is achieved via two metal framed graphite gaskets above and below the insulating ring toward the top of the electrode holder and toward the floor plate respectively.

The problem with the embodiments described in the latter two documents is that the graphite gasket requires high contact pressures to achieve sealing. Since ceramics material is brittle and has a low flexural strength the sealing surfaces of the floor plate and the top of the electrode holder are subject to strict evenness requirements. The slightest unevenness which is almost unavoidable in practice and high clamping torques result in high point loading and fracturing of the ceramic rings. The reactor consequently suffers leaks.

WO 2014/143910 A1 discloses a sealing ring between the floor plate and the electrode holder comprising a base body made of a ceramic material with an upper and a lower groove, wherein sealing elements are inserted into the respective grooves.

However, two opposite grooves weaken the mechanical properties of the insulating ring. Upon compression, in particular for uneven sealing surfaces, this can lead to fracturing of the insulating ring. The cutting of the grooves in the ceramic material of construction with the accompanying constructional standards (dimensional accuracy, low surface roughness) is very costly. The demands on the mating sealing surface (top of the electrode holder and floor plate) are likewise very high. This causes additional costs.

US 2010058988 A1 provides for securing the electrode holder in the floor plate via a conical PTFE sealing and insulating element. The top face of the conical PTFE sealing element is compressed against the electrode holder via a flange (cross-sectional widening). An O-ring is additionally provided both between the sealing element and the electrode feedthrough through the floor plate and between the sealing element and the shaft of the electrode holder.

The compression of the conical sealing element impedes removal of the electrode holder. Flow of the PTFE sealing body can result in the distance between the electrode holder and the floor plate falling below the minimum value. This results in electrical arcing/ground faults.

SUMMARY OF THE INVENTION

The object to be achieved by the invention arose from the problems described. The object is achieved by an apparatus for insulating and sealing electrode holders in CVD reactors which comprises an electrode which is suitable for accommodating a filament rod and is disposed atop an electrode holder made of an electrically conductive material and mounted in a recess in a floor plate, wherein provided between the electrode holder and the floor plate is an electrically insulating ring made of a material of construction having a specific thermal conductivity at room temperature of 0.2-50 W/mK, a minimum flexural strength of greater than 120 MPa and a specific electrical resistance at room temperature of greater than $10^9$ Ωcm, wherein at least two ring-shaped sealing elements for sealing between the electrode holder and the floor plate are present, wherein the electrically insulating ring or the electrode holder or the floor plate comprises at least one groove in which a first sealing element is secured, wherein at least one second sealing element not secured in a groove is present between the electrically insulating ring and the floor plate or between the electrically insulating ring and the electrode holder.

The object of the invention is further achieved by a process for producing polycrystalline silicon, comprising introducing a reaction gas comprising a silicon-comprising component and hydrogen into a CVD reactor comprising at least one filament rod which is disposed atop an apparatus according to the invention or on an apparatus according to one of the preferred embodiments, which is supplied with current via the electrode and which is thus heated by direct passage of current to a temperature at which polycrystalline silicon is deposited on the filament rod.

BRIEF DESCRIPTION OF THE DRAWINGS

FIG. 4a shows a schematic representation of a fitted insulating ring with a groove in the insulating ring and with a protrusion c of the top of the electrode holder and a sealing body in the groove before compression.

DETAILED DESCRIPTION OF THE PREFERRED EMBODIMENTS

Figure 1:
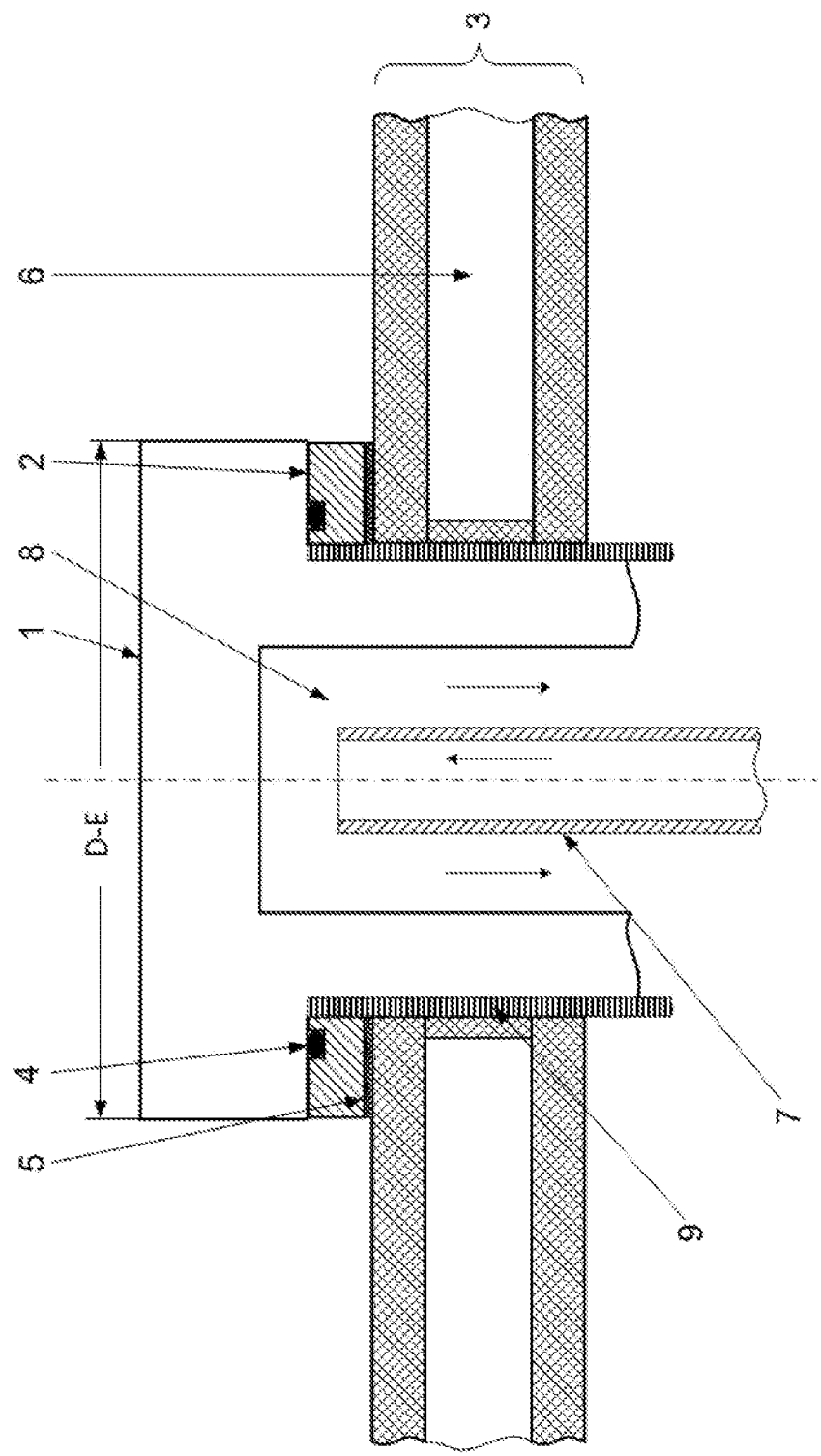
FIG. 1 shows a schematic representation of a fitted insulating ring having a groove in the insulating ring.

Preferred embodiments of the invention are discernible from the accompanying claims and the description which follows.

The invention provides for separating the sealing body and the insulating body, i.e. dividing sealing and insulating functions over a plurality of components, an insulating ring being provided for electrical insulation and two sealing elements being provided for sealing with respect to the floor plate and the electrode holder.

This makes it possible to choose for the insulating ring and the sealing part different materials of construction that are better suited for the respective functions of the two components.

In a departure from the prior art only one of the sealing elements is located in a groove in the insulating ring or in a groove in the floor plate or electrode holder. Either the seal against the floor plate or the seal against the electrode holder is effected by a sealing element secured in a groove but not both the seal against the floor plate and against the electrode holder.

On the opposite side of the insulating ring the seal against the floor plate or the electrode holder is effected by means of a sealing element not secured in a groove of the insulating ring, floor plate or electrode holder. In the simplest case this sealing element is a gasket.

The insulating ring should be high temperature resistant and dimensionally stable but a sealing function is not necessary. The higher dimensional stability compared to elastomeric insulating bodies allows insulating rings of greater height to be employed. The greater distance between the electrode holder and the floor plate permits application of greater electrical voltage. The advantage of this is that a plurality of rod pairs may be connected in series thus allowing savings to be made on capital expenditure on the reactor current supply.

In one embodiment the top of the electrode holder may have a protrusion c relative to the insulating ring. This affords further thermal and mechanical protection. The insulating ring is shaded from heat radiation and is subjected to lower levels of stress.

The thermal stress on the sealing elements is also reduced.

A protrusion is present when the external diameter of the electrode holder D_E is larger than the external diameter of the insulating ring D_R.

The groove for accommodating the first sealing element may be disposed either in the insulating ring or in the floor plate and/or in the top of the electrode holder.

In one embodiment the groove is located in the insulating ring and accommodates a sealing element to seal the insulating ring and the electrode holder. A second sealing element is located between the side of the insulating ring opposite the groove, and the floor plate.

In another embodiment the groove is located in the electrode holder and accommodates a sealing element to seal the insulating ring and the electrode holder. A second sealing element is located between the side of the insulating ring facing the floor plate, and the floor plate.

The groove is preferably located at a distance a of 10-40% of the total width b of the insulating ring to the electrode feedthrough (internal diameter of insulating ring). This ensures that the sealing element is sufficiently far removed from the side of the insulating ring facing the reactor. This is advantageous in relation to the thermal stress on the sealing elements.

In a further embodiment the groove may also be at the same position (distance a of 10-40% of the total width b of the insulating ring to the electrode feedthrough) in the floor plate or in the top of the electrode holder. In this case the insulating ring does not have a groove.

The sealing element secured in a groove is preferably cooled by the cooling medium in the floor plate and/or the cooling medium in the top of the electrode holder and the feedthrough of the electrode. As a result of the cooling, the sealing elements assume a considerably lower temperature than the insulating ring.

Suitable sealing elements in the groove are in particular an O-ring made of FFKM (perfluoro rubber), a graphite foil ring, a graphite-filled spiral seal or a metal C-ring.

A silver-coated metal C-ring with or without an internal coil spring is preferred.

The use of a graphite foil ring is particularly preferred.

A gasket is employed as the second sealing element not secured in a groove. This gasket may be fabricated from graphite or from PTFE, preferably from graphite. The gasket preferably has at its edges at least one metal flange, wherein a metal flange is preferably attached to the side facing the reactor space. Particular preference is given to a gasket made of graphite having a reactor-side metal flange. In one embodiment this gasket is located between the insulating ring and the floor plate.

The side of the insulating ring facing the reactor interior has a surface temperature of up to 600° C. The sealing elements should therefore withstand sustained use temperatures of greater than 250° C.

Low thermal conductivity of the insulating ring facilitates the low thermal stress on the sealing elements.

The gasket serves to compensate for fabrication inaccuracies (unevennesses) in the mating sealing surface as are customary for large workpieces (floor plates) in apparatus manufacture with standard methods (e.g. turning, drilling, welding). Further precision machining (e.g. grinding, polishing) increases fabrication costs for the apparatuses.

By contrast, small components (top of the electrode holder) can be precision machined without substantial additional costs and compensation of fabrication inaccuracies is therefore not necessary here.

The top of the electrode holder typically receives poorer cooling than the floor plate. It is therefore advantageous when the sealing element between the insulating ring and the top of the electrode holder is better protected from thermal stress from the reactor space. In a preferred embodiment this may be achieved by placing the sealing element in a groove, wherein the groove is recessed in the insulating ring or in the top of the electrode holder.

The groove is located at a distance a of 10-40% of the total width b of the insulating ring to the electrode feedthrough (internal diameter of insulating ring). Furthermore, the chambering of the sealing element by the groove minimizes diffusion of reaction gas through the sealing element since for diffusion only a very small maximum protrusion of the sealing element from the groove f of 0-1 mm, preferably of 0-0.3 mm, is permissible.

Depending on the nature of the sealing body in the groove, two embodiments are possible. In a 1st embodiment, metal C-rings and O-rings have a protrusion f of 0 mm after compression. Force transmission occurs not through the sealing body but around the sealing body in a force bypass. Depending on the position of the groove, force transmission occurs between the electrode holder and a supporting ring or the supporting ring and the floor plate.

In a 2nd embodiment, graphite foil rings or spiral seals have a greater thickness than the groove depth. The plastic deformation of the sealing bodies during compression causes the part of the seal protruding from the groove to begin to flow. The original protrusion of the sealing body F in the uncompressed state is flattened in the course of the compression to a smaller, remaining protrusion f>0 and ≤1 mm. Simultaneously, when the groove is located in the electrode holder or in the supporting ring on the side facing the electrode holder sealing material flows into the slot having a thickness f>0 mm and ≤1 mm between the electrode holder and the supporting ring.

When the groove is positioned in the floor plate or in the supporting ring on the side facing the floor plate sealing material correspondingly flows into the slot having a thickness f>0 mm and ≤1 mm between the supporting ring and the floor plate during compression.

As a result of the flowing of the sealing body the width of the sealing body increases to the value e in the sealing slot by 5-100%, preferably 5-70%, based on the width of the groove/width of the sealing body in the uncompressed state E. As a result of the flowing of the sealing body in the sealing slot during compression the sealing material fills very small unevennesses in the to-be-sealed surfaces of the supporting ring and/or floor plate. Furthermore, the flowing of the sealing material increases the sealing area. Both effects, compensating unevennesses and greater sealing area, achieve complete sealing of the interfaces between the sealing body and the supporting ring and also between the sealing body and the electrode holder or between the sealing body and the floor plate. Since at any point in time during compression the protrusion f of the sealing body is >0 mm and ≤1 mm, force transfer occurs through the sealing body in a direct force transmission.

For further thermal and mechanical protection the top of the electrode holder may project beyond the external contour of the insulating ring. The protrusion c may be 0 to 30 mm.

In one embodiment the protrusion is 0 to 15 mm.

Compared to a one-part sealing and insulating ring the material properties in multi-part constructions may be better configured for the respective demands on the sealing function and insulating function.

The insulating ring need not have any sealing material properties. There is therefore no compulsion to use PTFE and materials of construction having higher dimensional stability and thermal stability may be employed. The sustained use thermal stability of PTFE is 250° C. By contrast, the ceramic materials of construction have a sustained use thermal stability of >1000° C. and higher dimensional stability.

The specific thermal conductivity at room temperature of the insulating ring is in the range from 0.2-50 W/mK, preferably 0.2-20 W/mK, and more preferably in the range of 0.2-5 W/mK.

The specific electrical resistance of the insulating ring at room temperature is greater than $10^9$ Ωcm, preferably greater than $10^{11}$ Ωcm, and more preferably greater than $10^{13}$ Ωcm.

To compensate for unevennesses on the application surfaces of the floor plate and the top of the electrode holder, the insulating ring must have a minimum flexural strength.

The flexural strength of the insulating ring must be greater than (determined as per DIN EN 843 for ceramics) 120 MPa, preferably greater than 300 MPa, and more preferably greater than 800 MPa. In addition, ceramics must have K1C values (fracture toughness as per DIN CEN/TS 14425) of greater than 3 MPa*m^0.5, preferably greater than 4 MPa*m^0.5.

Suitable materials for the insulating ring therefore include: aluminum oxide ($Al_2O_3$); silicon nitride ($Si_3N_4$); boron nitride (BN); zirconium oxide ($ZrO_2$), zirconium oxide stabilized with yttrium oxide ($ZrO_2$—$Y_2O_3$), with magnesium oxide ($ZrO_2$—MgO) or with calcium oxide ($ZrO_2$—CaO).

Particular preference is given to yttrium-stabilized zirconium oxide produced by the HIP process (hot isostatic pressing) since this material of construction has a flexural strength of greater than 1200 MPa at 20° C. and a fracture toughness of >6 MPa*m^0.5.

The sealing element present in the groove should withstand a sustained use temperature of 320° C. and be resistant to an HCl/chlorosilane atmosphere at up to 320° C.

Possible materials of construction are FFKM (perfluoro rubber), graphite and metallic seals resistant to oxidative acids.

Possible sealing elements made of graphite may be graphite cords made of braided graphite fibers and graphite foil rings. A graphite foil ring consists of a plurality of graphite plies pressed together. The sustained use temperature of these sealing elements made of graphite is up to 600°C.

Low compression forces suffice for the sealing elements made of graphite since the sealing area is very small. The sealing area is determined by the dimensions of the groove. The sealing area is preferably between 600 and 3000 mm², more preferably between 600 and 2000 mm² and most preferably between 600 and 1500 mm². The contact pressure on the graphite sealing elements is between 20-70 N/mm², preferably 25-50 N/mm², and more preferably 30-40 N/mm². This results in only a low level of mechanical stress on the insulating ring which prevents fracturing of the insulating rings.

In a further embodiment seals made of metal are concerned.

The sealing elements made of metal are preferably metallic annular spring seals. Due to the small sealing areas of the metallic sealing elements a low compression force suffices for sealing here too. For the metal sealing elements a low compression force is to be understood as meaning a compression force of 60-300 N/mm of seal circumference, preferably 60-200 N/mm of seal circumference, more preferably 60-160 N/mm of seal circumference.

The metallic seals preferably have one of the following shapes:

closed O-ring hollow on the inside (hollow metal O-ring);

open metal profiles, for example C-shaped, U-shaped, E-shaped or any other desired profiles having a spring action, for example corrugated metal sealing rings;

open metal profiles may be spring supported, for example a C-ring with an additional internal coil spring.

A C-ring is a hollow O-ring having an open inside or outside.

To increase chemical resistance and to increase the sealing action, the metallic sealing elements may be coated with ductile metals, for example with silver, gold, copper, nickel or with another ductile and HCl/chlorosilane atmosphere-stable metal. The flowability of these ductile coating materials markedly increases the sealing action of the metallic sealing elements. These sealing elements made of metal have a sustained use temperature of up to 850° C.

The term "ductile coating materials" is to be understood as meaning metals where the grain boundaries and dislocations move/flow under mechanical stress even at an elongation less than the elongation at break. This flowing under the stress of an application of force, as is present during compression, compensates unevennesses in the sealing surfaces. This achieves improved sealing.

The use of a silver-coated metal C-ring with or without internal coil spring is particularly preferred.

Possible sealing elements made of FFKM are O-rings.

The gaskets employed may be made of graphite or PTFE, in the case of PTFE with or without fillers such as fused quartz or iron oxide to increase strength and reduce flow propensity.

Gaskets made of graphite may be encapsulated in a thin (less than 0.5 mm) elastomeric layer (PTFE) to improve sealing.

To avoid a leakage stream through the sealing material by diffusion the gaskets are preferably chambered on the reactor-side seal circumference.

To this end a thin metal foil, preferably made of a halosilane-resistant stainless steel, preferably 1.4571 or 316L, or silver, is flanged around the reactor-facing sealing surface.

The foil thickness here is 0.05-0.3 mm.

In addition, the gasket may also be chambered on the inner seal circumference, i.e. facing the shaft of the electrode holder.

The features listed in connection with the abovedescribed embodiments of the process according to the invention may be correspondingly applied to the apparatus according to the invention. Conversely, the features listed in connection with the abovedescribed embodiments of the apparatus according to the invention may be correspondingly applied to the process according to the invention. These and other features of the embodiments according to the invention are elucidated in the description of the figures and in the claims. The individual features may be implemented either separately or in combination as embodiments of the invention. Said features may further describe advantageous implementations eligible for protection in their own right The invention is also elucidated hereinbelow with reference to FIGS. 1 to 9.

LIST OF REFERENCE NUMERALS USED 1 electrode holder
2 insulating ring
3 floor plate
4 sealing element
5 gasket
6 floor plate cooling means
7 electrode holder cooling feed
8 electrode holder cooling means
9 insulating sleeve
10 groove for sealing element
11 flange
a groove distance from internal diameter
b total width
h insulating ring height
c protrusion of the electrode holder
f protrusion of sealing element after compression
F protrusion of sealing element before compression
e width of sealing element after compression
E width of sealing element before compression
D_E electrode holder external diameter
D_R insulating ring external diameter FIG. 1 shows a schematic representation of a fitted insulating ring with a groove in the insulating ring. Located between electrode holder 1 and floor plate 3 are insulating ring 2 and sealing element 4 and also gasket 5.

The floor plate 3 is provided with a hole which is lined with an insulating sleeve 9 and through which an electrode holder 1 has been passed and fitted.

Floor plate 3 and electrode holder 1 are cooled by cooling means 6 and 8 respectively.

7 shows the feed for the cooling means 7 of electrode holder 1.

Sealing is effected on the one hand via sealing element 4 and gasket 5.

Sealing element 4 is located in a groove in insulating ring 2 toward the electrode holder 1

Gasket 5 is located between insulating ring 2 and floor plate 3.

The external diameter D_E of electrode holder 1 may be flush or protruding relative to the external diameter D_R of the insulating ring 2. The electrode holder is preferably protruding.

FIG. 1 shows an embodiment without a protrusion.

FIGS. 4a and b show an embodiment with a protrusion c

For further thermal and mechanical protection the top of the electrode holder 1 may thus project beyond the external contour of the insulating ring 2. The protrusion c should be 0-8*h, wherein h is the height of the insulating ring 2. A protrusion of 0-4*h is particularly preferred.

Figure 2:
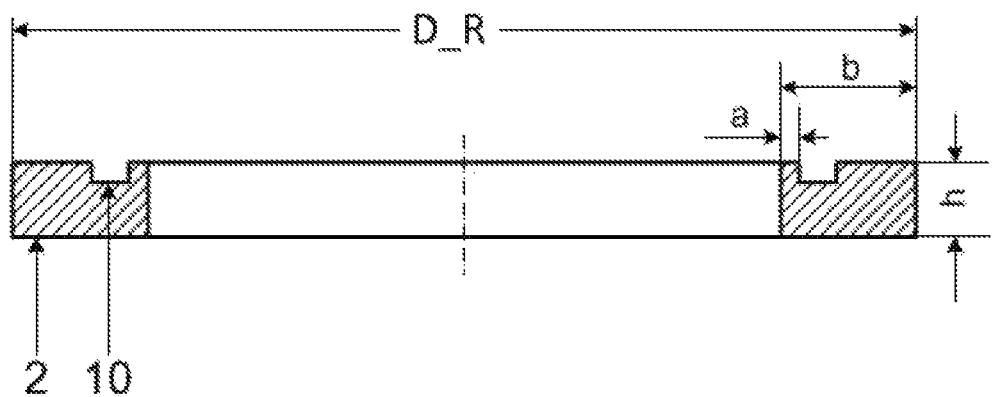
FIG. 2 shows a schematic diagram of an insulating ring with a groove.

FIG. 2 shows an insulating ring 2 with a groove 10 for accommodating a sealing element. The groove is preferably located at a distance a of 10-40% of the total width b of the insulating ring to the electrode feedthrough (internal diameter of insulating ring). This ensures that the sealing element is sufficiently far removed from the side of the insulating ring facing the reactor. This is advantageous in relation to the thermal stress on the sealing elements.

Figure 3:
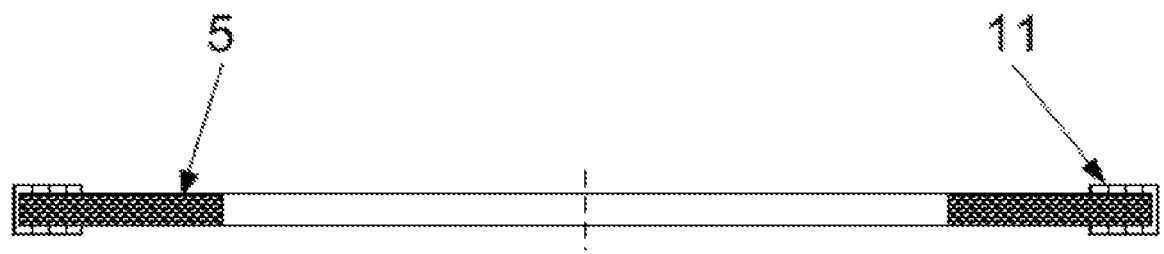
FIG. 3 shows a schematic representation of an externally flanged gasket.

FIG. 3 shows an externally flanged gasket 5 with a flange 11.

FIG. 4a shows a schematic representation of a fitted insulating ring 2 with a groove in which sealing element 4 is secured. The representation shows the state of the sealing element before compression with the width E of the sealing body and the protrusion F of the sealing body from the groove in the starting state. Sealing with respect to the floor plate 3 is effected by means of a gasket 5. An embodiment with a protrusion c is concerned.

Figure 4B:
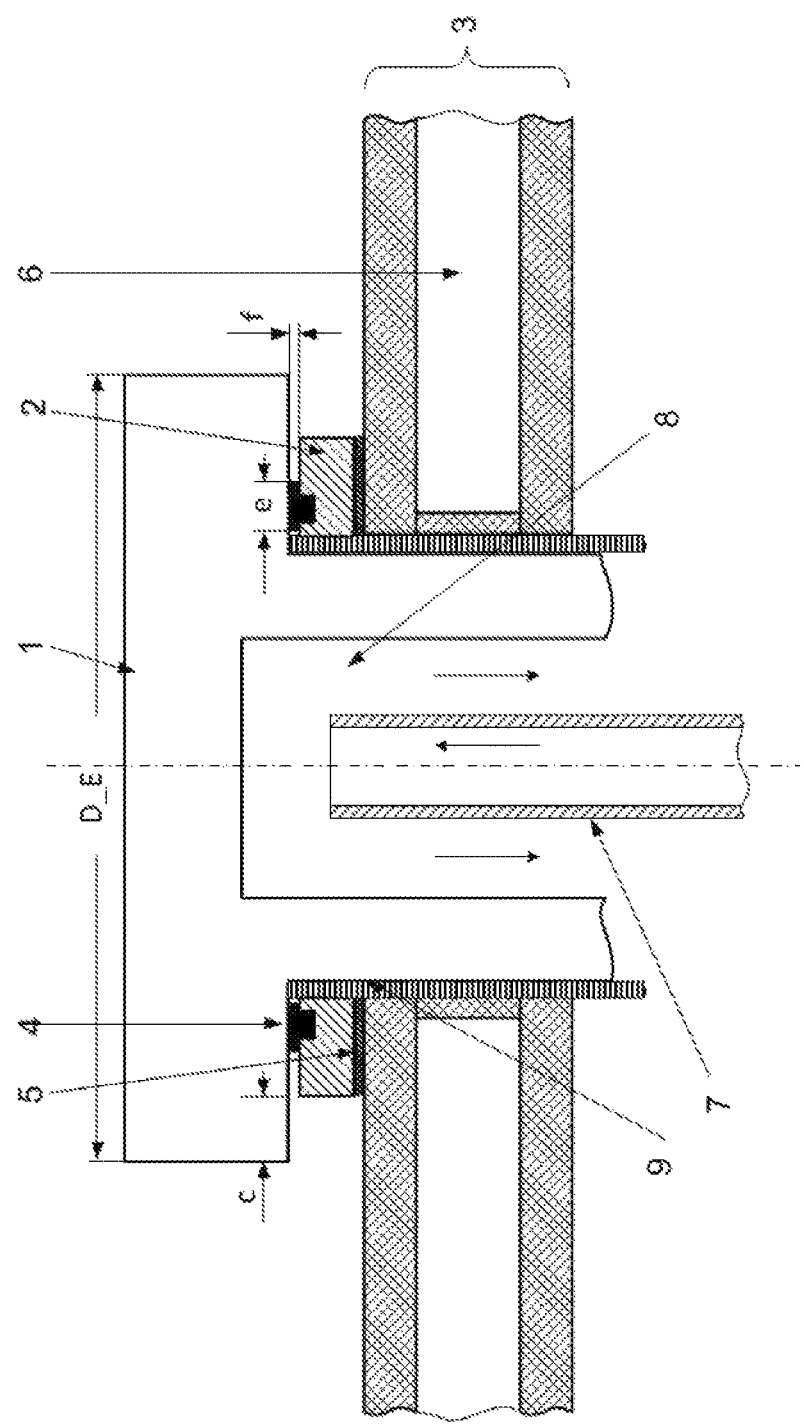
FIG. 4b shows a schematic representation of a fitted insulating ring with a groove in the insulating ring and with a protrusion c of the top of the electrode holder and a sealing body in the groove after compression.

FIG. 4b shows a schematic representation of a fitted insulating ring 2 with a groove in which sealing element 4 is secured. In the following, the sealing body is a spiral seal compression a graphite foil ring. The representation shows the state of the sealing element after compression with the width e of the sealing body after compression and the protrusion f of the sealing body from the groove after compression. Sealing with respect to the floor plate 3 is effected by means of a gasket 5. An embodiment with a protrusion c is concerned. As a result of the increase in the sealing area on account of the greater width e of the sealing body leakage between the insulating ring and the sealing body and between the sealing body and the electrode holder is reduced by the factor of increase in the sealing area.

At least 70%, preferably >85% of the height of the sealing body in the compressed state is encapsulated in the groove. Internal leakage by diffusion through the sealing material is thus possible only over not more than 30% of the circumferential area of the sealing body, preferably <15% of the circumferential area of the sealing body, in the compressed state. The greater sealing width a of the sealing body after compression further reduces leakage through the sealing material in the ratio of the sealing width e in the compressed state to the sealing width E in the uncompressed state.

Figure 5:
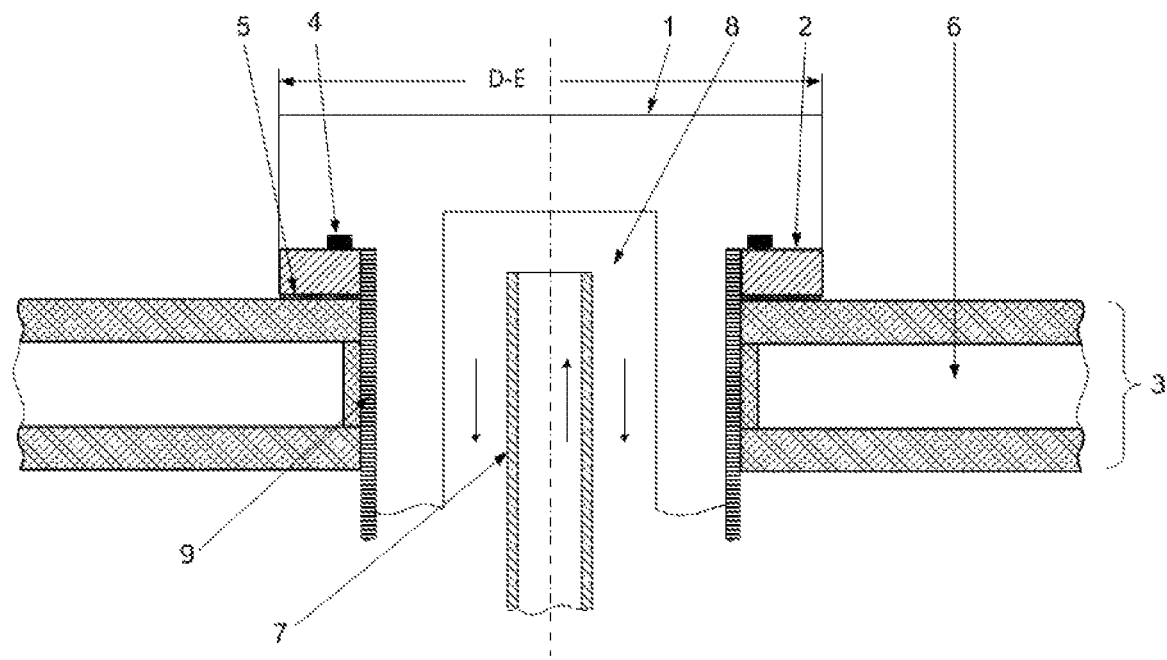
FIG. 5 shows a schematic representation of a fitted insulating ring with a groove in the electrode holder.

FIG. 5 shows an implementation where the sealing element 4 is located in a groove 10 in the electrode holder 1. Sealing on the opposite side, i.e. between the insulating ring 2 and the floor plate 3, is effected by means of a gasket 5.

Figure 6:
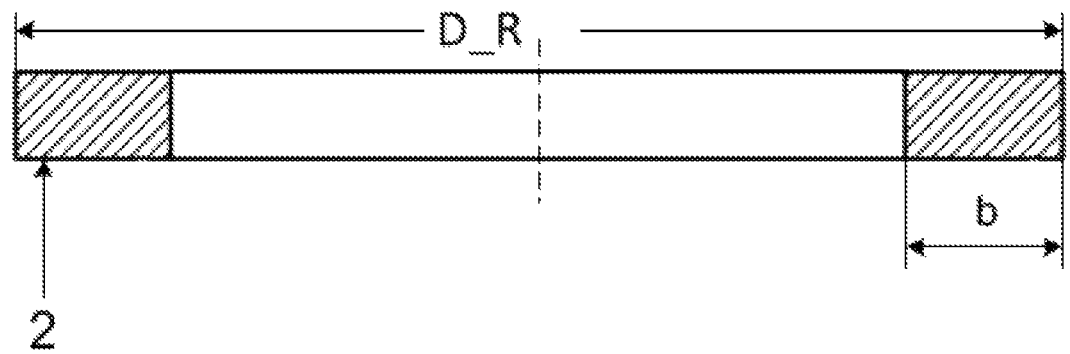
FIG. 6 shows a schematic diagram of an insulating ring without a groove.

FIG. 6 shows a schematic representation of an insulating ring 2 without a groove. Such an insulating ring is employed in the implementation according to FIG. 5 where the groove for accommodating the sealing element 4 is located in the electrode holder 1.

Figure 7:
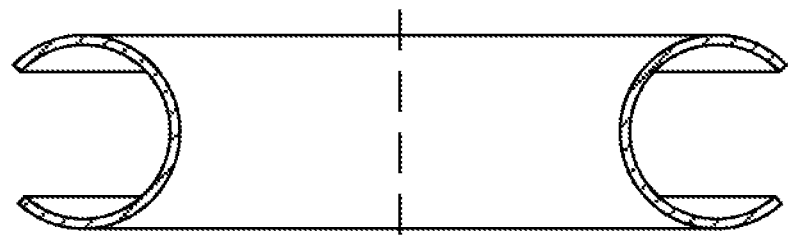
FIG. 7 shows a cross section through a metal C-ring.

FIG. 7 shows a cross section through a metallic sealing element having a C-profile.

Figure 8:
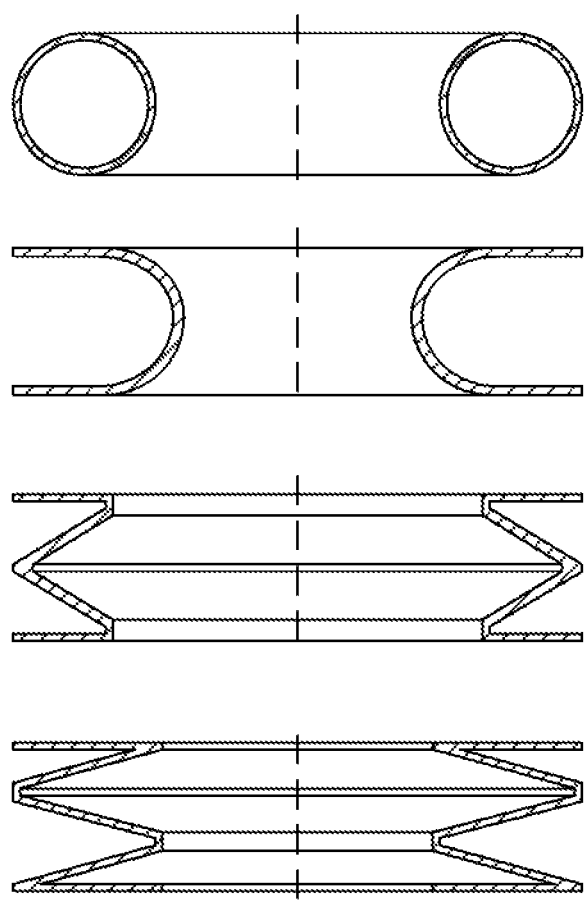
FIG. 8 shows cross sections through further implementations for sealing elements made of metal.

FIG. 8 shows cross sections through further implementations for sealing elements made of metal, namely O-profile, U-profile. E-profile, spring-action profile.

The E-ring is a twice-folded double U-ring.

Figure 9:
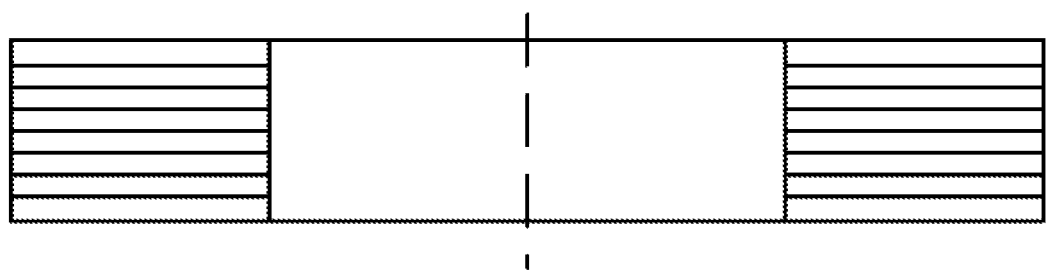
FIG. 9 shows a cross section through a graphite foil ring consisting of a plurality of compressed individual foils

FIG. 9 shows a cross section through a graphite foil ring consisting of a plurality of compressed individual foils.

EXAMPLES

Polycrystalline silicon rods having a diameter between 160 and 230 mm were deposited in a Siemens deposition reactor.

Several implementations of insulating rings and sealing elements were tested. The results of these tests are hereinbelow elucidated on selected examples and comparative examples.

The parameters of the deposition process were identical in each case for all experiments. The deposition temperature was between 1000° C. and 1100° C. in the batch run. During the deposition process a feed consisting of one or more chlorine-containing silane compounds of formula $SiH_nCl_{4-n}$ (where n=0 to 4) and hydrogen was added as carrier gas.

The experiments differed exclusively in the implementation of the insulating rings and the sealing elements.

For comparison, a PTFE insulating ring which simultaneously assumes sealing and insulating functions was initially analyzed. This ring thus does not provide for division of functions via an insulating ring and additional sealing elements.

Insulating rings made of zirconium oxide in conjunction with metallic sealing elements were also tested. Sealing elements made of graphite or of elastomeric materials of construction such as perfluoroelastomers yield comparable results.

By way of comparison an implementation was investigated where the sealing elements are secured in grooves of the zirconium oxide ring.

It was found that the advantageous implementations have at least one sealing element secured either in a groove in the floor plate or in a groove in the electrode holder. A protrusion of the electrode holder relative to the insulating ring can further reduce the thermal stress on the sealing elements.

Comparative Example

CVD reactor with insulating ring made of PTFE:

In this prior art embodiment the insulating ring made of PTFE assumes the sealing function and the insulating function. Owing to low dimensional stability the height of the insulating ring is limited to 7 mm when new.

Because of the high thermal stress during operation and the necessary pressing force of 30 to 40 kN to ensure the sealing function of the insulating ring the height of the insulating ring was reduced to a minimum value of 4 mm within 3 months.

The service life is thus limited to 3 months.

Owing to the thermal stress brought about by the hot reaction gas both the sealing of the floor plate and the electrical insulation were no longer intact due to thermal cracking and settling of the sealing body. Thus after this period costly and inconvenient replacement of all insulating rings was required. Repair operations resulted in a considerable loss of capacity.

Example

CVD reactor with insulating ring made of zirconium oxide (ZrO2):

In this implementation the sealing function and the insulating function are divided over two components. The insulating ring made of $ZrO_2$ is employed to achieve electrical insulation between the electrode holder and the floor plate. The insulating ring has a height of 8 mm when new.

The insulating ring has a groove toward the top of the electrode holder. The sealing function is assumed by a graphite foil ring in the groove and a graphite gasket having a metal flange toward the floor plate, the flange being oriented toward the reaction space. Being a ceramic component $ZrO_2$ does not exhibit settling behavior. After compression the graphite foil ring still had a protrusion f between the top of the electrode holder and the insulating ring of 0.3 mm. The graphite foil ring was compressed with a contact pressure of 35 $N/mm^2$. After 12 months the insulating ring was replaced in the course of regular maintenance cycles. The width e of the graphite foil ring outside the groove was 1.6 times the width E of the graphite foil ring in the groove of the supporting ring. As a result of the very high thermal stability and the markedly higher specific heat conductivity compared to PTFE the side of the insulating ring facing the reactor and also the graphite foil ring and the gasket had not undergone thermal attack. No silica deposits were detected at the shaft of the electrode holders after exchange of the electrode holders. Service life was increased to 12 months. The sealing system, i.e. insulating ring and sealing elements, is thus no longer limiting of service life.

The description hereinabove of illustrative embodiments is to be understood as being exemplary. The disclosure made thereby enables a person skilled in the art to under-stand the present invention and the advantages associated therewith and also encompasses alterations and modifications to the described structures and processes obvious to a person skilled in the art. All such alterations and modifications and also equivalents shall therefore be covered by the scope of protection of the claims.

The invention claimed is:

1. An apparatus for insulating and sealing electrode holders in CVD reactors having an electrode suitable for accommodating a filament rod disposed atop an electrode holder made of an electrically conductive material and mounted in a recess in a floor plate, comprising:
an electrically insulating ring made of a material of construction having a specific thermal conductivity at room temperature of 0.2-50 W/mK, a minimum flexural strength of greater than 120 MPa, and a specific electrical resistance at room temperature of greater than $10^9$ Ωcm, located between the electrode holder and the floor plate,
wherein at least two ring-shaped sealing elements for sealing between the electrode holder and the floor plate are present, wherein the electrically insulating ring or the electrode holder or the floor plate comprises at least one groove in which a first sealing element is secured, wherein at least one second sealing element not secured in a groove is present between the electrically insulating ring and the floor plate or between the electrically insulating ring and the electrode holder, and wherein the at least two ring-shaped sealing elements are not located on the same side of the electrically insulating ring.

2. The apparatus of claim 1, wherein the material of construction of the electrically insulating ring is selected from the group consisting of aluminum oxide, silicon nitride, boron nitride, zirconium oxide, and yttrium-oxide-, magnesium-oxide- or calcium-oxide-stabilized zirconium oxide.

3. The apparatus of claim 2, wherein the first sealing element is a graphite foil ring.

4. The apparatus of claim 1, wherein the first sealing element is a graphite foil ring.

5. The apparatus of claim 1, wherein the first sealing element is a metallic O-ring or a metallic seal having an open profile having a spring action.

6. The apparatus of claim 5, wherein the metallic seal has a C-profile and is coated with silver.

7. The apparatus of claim 1, wherein the second sealing element is a gasket comprising graphite or PTFE.

8. The apparatus of claim 7, wherein the gasket is chambered on the reactor-side seal circumference as a result of metal or silver foil being flanged around the reactor-side sealing surface of the gasket.

9. A process for producing polycrystalline silicon, comprising introducing a reaction gas comprising a silicon-comprising component and hydrogen into a CVD reactor comprising at least one filament rod which is disposed atop an apparatus of claim 1, the filament rod supplied with current via the electrode and thus heated by direct passage of current to a temperature at which polycrystalline silicon deposits on the filament rod.

* * * * *